United States Patent [19]

Anahara et al.

[11] 4,200,835
[45] Apr. 29, 1980

[54] METHOD AND APPARATUS FOR MEASURING THE INSULATION RESISTANCE OF AN OPERATING GROUNDED TRANSMISSION LINE SYSTEM

[75] Inventors: Ryoji Anahara; Koichi Sato; Motoshiro Kaneda; Mitsuo Saito, all of Kawasaki, Japan

[73] Assignee: Fuji Electric Co., Ltd., Tokyo, Japan

[21] Appl. No.: 910,960

[22] Filed: May 30, 1978

[51] Int. Cl.² .............. G01R 31/02; G01R 27/18
[52] U.S. Cl. .................................. 324/51; 324/54; 340/649
[58] Field of Search ............... 324/51, 54, 62; 340/647, 649–651

[56] References Cited

U.S. PATENT DOCUMENTS

| | | | |
|---|---|---|---|
| 2,923,879 | 2/1960 | Povey | 324/54 |
| 3,678,376 | 7/1972 | Jaster et al. | 324/54 |
| 3,710,238 | 1/1973 | Peterson | 340/650 X |
| 3,774,106 | 11/1973 | MacPhee | 324/51 |
| 3,842,344 | 10/1974 | Povey | 324/54 |
| 3,866,117 | 2/1975 | Erdman | 324/54 |
| 3,891,895 | 6/1975 | Wittlinger | 324/51 X |
| 3,971,007 | 7/1976 | Borkovitz et al. | 324/51 X |
| 3,978,465 | 8/1976 | Goode | 324/51 X |
| 4,066,950 | 1/1978 | Rumold et al. | 324/51 |
| 4,112,354 | 9/1978 | Bahder et al. | 324/54 |

Primary Examiner—Gerard R. Strecker
Attorney, Agent, or Firm—Bruce L. Birchard

[57] ABSTRACT

By introducing a secondary voltage having a lower frequency than the principal voltage in a grounded transmission line system, detecting the current arising from such secondary voltage only and multiplying such current by the magnitude of the secondary voltage a resultant signal is obtained which is proportional to the inverse of the insulation resistance of the system.

10 Claims, 3 Drawing Figures

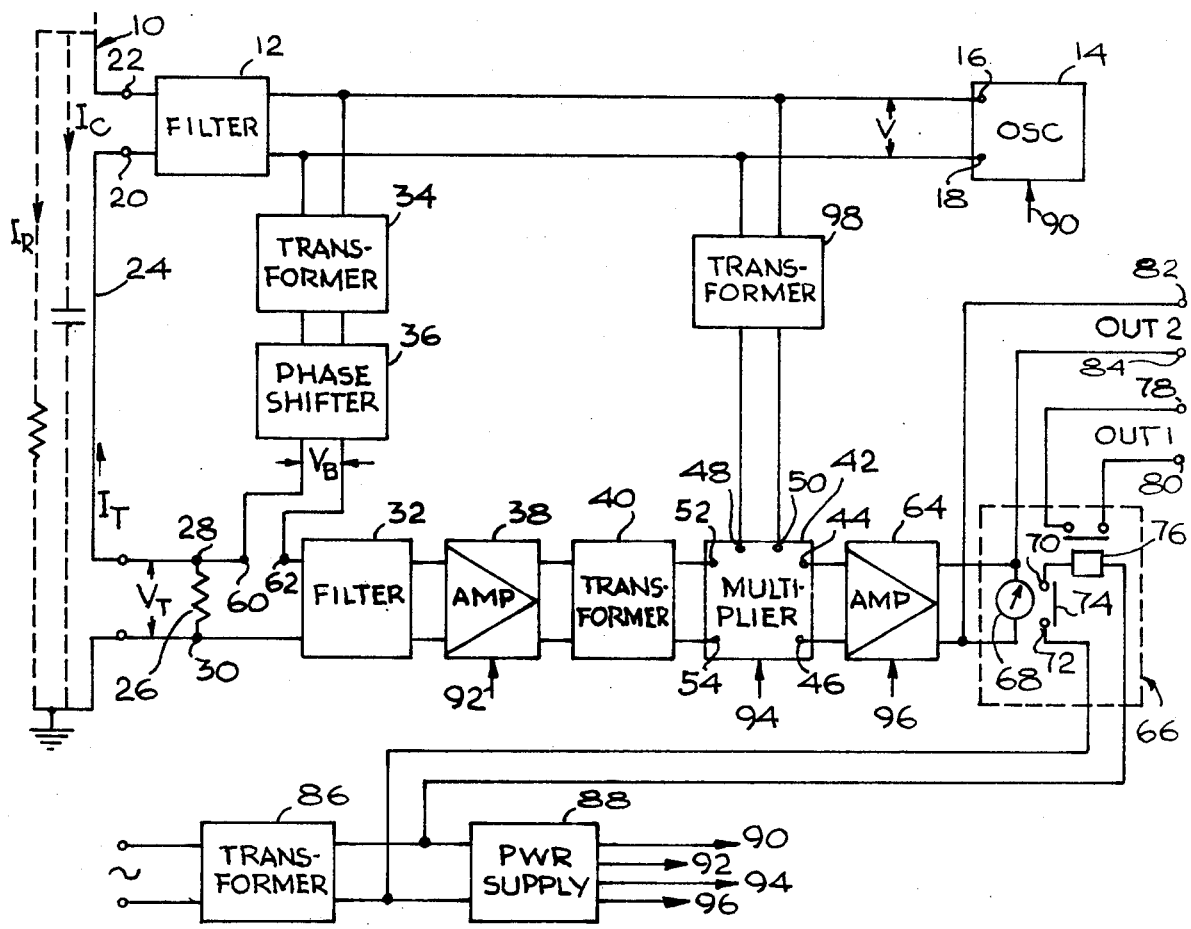
Fig. 1
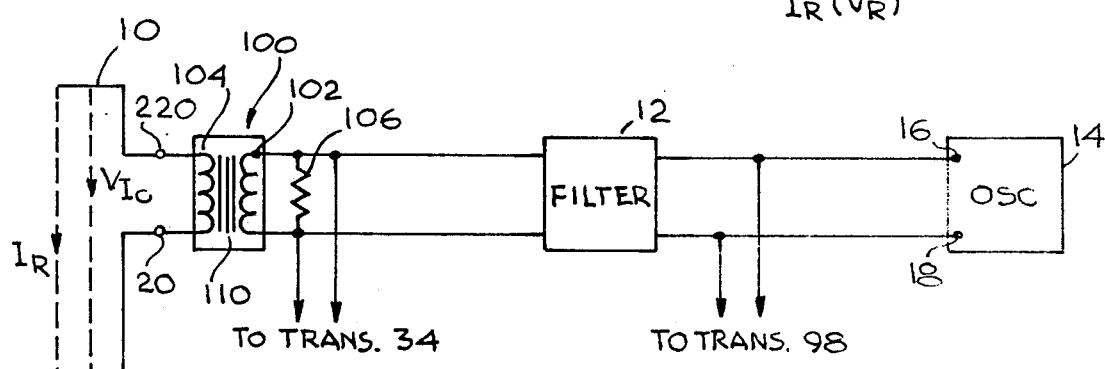
Fig. 2
Fig. 3

METHOD AND APPARATUS FOR MEASURING THE INSULATION RESISTANCE OF AN OPERATING GROUNDED TRANSMISSION LINE SYSTEM

BACKGROUND OF THE INVENTION

1. Field of the Invention

This invention relates to insulation resistance measuring apparatus and, more specifically to such apparatus which can be operated without shutting down the transmission system in which the insulation resistance is being measured.

2. Prior Art

In the past, insulation resistance has been measured with high voltage, low current generators, sometimes referred to as "meggers". Alternatively, other systems have been provided which have not been capable of operating in grounded transmission line systems, such as the single-phase, two or three wire systems commonly used to provide power to domestic users. Meggers cannot be used with the power line "hot", i.e. operational. The inherent high distributed capacitance in power line systems defeats the other prior art insulation measuring apparatus.

SUMMARY OF THE INVENTION

Stated succinctly, this invention resides in introducing in a grounded transmission line system a secondary voltage at a frequency which is low compared to the frequency of the principal current being transmitted. For example, in a 60 Hz. power transmission system a secondary voltage at a frequency of 10 Hz. might be introduced. This wide frequency separation makes selective filtering of the voltages (and accompanying currents) practicable.

The current flowing in the system as a result of the secondary voltage is indicated at a point close to or spaced from the injection point by a current-carrying resistor connected between the "hot" line of the system and ground.

The voltage appearing across that resistor is amplified and multiplied by the initial secondary voltage V to give, in the output of the multiplier a signal with a d-c. component proportional to $V^2/R$, where V is the secondary voltage and R is the insulation resistance. With V held constant this output signal is directly proportional to the insulation conductance, or, more familiarly, inversely proportional to the insulation resistance. This signal may be used to activate a resistance-calibrated meter or to activate an alarm when the resistance becomes too low. Greater accuracy may be obtained with the apparatus if a phase-shifting network is utilized to introduce a voltage which "bucks" or opposes the component of the detected secondary current which has been produced by quadrature current flowing in the distributed capacitance of the transmission line at the frequency of the secondary voltage.

BRIEF DESCRIPTION OF THE DRAWINGS

The invention can best be understood by referring to the discussion which follows taken in conjunction with the accompanying drawings, in which:

FIG. 1 is a block diagram of apparatus according to the present invention;

FIG. 2 is a vector diagram of the relationship of certain currents utilized in the apparatus of the invention; and FIG. 3 is a block diagram showing a variation of the insulation resistance measuring apparatus according to the present invention.

DETAILED DESCRIPTION OF THE PREFERRED EMBODIMENT

In FIG. 1, line 10 is a transmission line conductor the insulation resistance to ground from which it is desired be determined.

Filter 12 is an L-C network which is series resonant at the standard line frequency of, say, 60 hz., and parallel resonant at a selected secondary frequency, say 10 hz. Such network designs may be found in any standard handbook or text or electrical engineering and may comprise, for example, a series L-C combination shunted by an L. Because the network is series resonant at 60 hz. current to normal loads on the system may pass through filter 12 substantially unimpeded. At the same time filter 12 presents a high impedance to currents at the frequency, say 10 hz., of the voltage from secondary voltage source 14. A voltage "V" appearing between terminals 16 and 18 of source 14 appears, in substantially undiminished form between output terminals 20 and 22 of filter 12. Each of those terminals is above ground potential. The current $I_T$ which flows at 10 hz. through conductor on line 24 is made up of $I_C$, the stray or distributed capacitance current, and $i_R$, the insulation resistance current. The current $I_T$ flows through a large dropping resistor 26, which returns to the ground side of the transmission system. At the frequency of the secondary voltage V the total current $I_T$ flowing through resistor 26 produces a voltage drop $V_T$ between terminals 28 and 30 of that resistor. That voltage $V_T$ is phase-shifted from the secondary voltage V from oscillator or source 14 by a phase angle "P" as can be seen in FIG. 2. $V_T$ is made up of two vector components, $V_R$ and $V_C$. As can be seen from FIG. 2 the current flowing through resistor 26 is made up largely of current flowing into the stray or distributed capacitance $C_D$ of the system. Sometimes phase angle P may equal or exceed 85 degrees. This makes accurate measurement of the insulation resistance difficult, for if the gain of amplifier 38 is increased to increase its sensitivity to the in-phase voltage $V_R$ the amplifier is likely to saturate on the component $V_C$. Vector $V_C$ ($I_C$) is not useful in determining the insulation or leakage resistance. Thus, elimination of $V_C$ is desirable.

To accomplish that end, a portion of voltage V is taken through variable transformer 34, which may be a conventional auto-transformer, and an R-C phase shifting network 36 to produce a bucking voltage $V_B$ which leads voltage V by a large phase angle approximating the phase angle of voltage $V_C$ plus 180°. This bucking voltage $V_B$ is added to $V_T$ at the input to filter 32 and substantially cancels out $V_C$, leaving the desired component $V_R$ to pass through filter 32 and the stages of the measuring apparatus which follow filter 32. Filter 32 permits signals at the frequency of secondary voltage V to pass amplifier 38 but rejects or by-passes currents at the fundamental transmission-line frequency. Filter 32 may be inserted ahead of the injection point for the output $V_B$ of phase shifter 36. Filter 32 is a high-cut, low pass filter the design for which may be obtained from any standard electrical engineering handbook.

Amplifier 38 raises the level of the output signal from filter 32 which signal, at this point, is primarily made up of $V_R$. For impedance matching purposes transformer 40 may be inserted between amplifier 38 and multiplier 42. Multiplier 42 may be any one of the various brands of operational amplifiers having a multiplying function. The output signal appearing at terminals 44 and 46 is the product of the input signals applied to input terminals 48, 50 and 52, 54, respectively.

The signal applied to input terminals 52 and 54 of multiplier 42, if the bucking action of $V_B$ is ignored, as by joining points 60 and 62 and removing phase shifter 36 from the circuit, or if bucking voltage $V_B$ is not totally effective, is representative of the distributed capacitance current $I_C$ and the insulation resistance current $I_R$ which make up the total current at the frequency of oscillator 14.

The instantaneous voltage $V_p$ produced between terminals 20 and 22, by oscillator 14, ignoring any losses in filter 12, is:

$$V_p = \sqrt{2V} \sin w\, t,$$

where W is 2 times the chosen frequency of oscillator 14.

The current $I_T$ which flows as a result of $V_p$ is:

$$I_T = \sqrt{2V}/R \sin w\, t + \sqrt{2V}\, wC \cos w\, t,$$

where R is the insulation resistance and C is the distributed capacitance of the transmission system.

If the voltage $V_p$ is multiplied by the current $I_T$ the following product occurs, ignoring constants:

$$V_p \times I_T = V^2/R - (V^2/R \cos 2\, wt - wCV^2 \sin 2\, wt) \ldots$$

The term $V^2/R$ is the d.c. component of the output signal at terminals 44 and 46 of multiplier 42. As can be seen from the foregoing equation, that d.c. component is inversely proportional to the parameter to be measured, namely the insulation resistance R.

It is apparent from this equation that the oscillator 14 must have a constant voltage output, once the apparatus is calibrated, to assure accuracy of the insulation or leakage resistance measurement. That voltage is applied through transformer 98 to terminals 48,50.

A d.c. amplifier 64 amplifies the d.c. component at output terminals 44 and 46 of multiplier 42 and supplies it to meter relay 66. Meter relay 66 includes meter 68, which may be calibrated in ohms of insulation resistance, meter relay contracts 70 and 72 which may be closed by contact 74 when insulation resistance becomes excessively low, and time delay relay 76 which prevents spurious or short term reductions in insulation resistance from triggering alarm equipment, for example, connected to output terminals 78, 80. Additional output terminals 82, 84 are provided for auxiliary indicators.

Operating power is provided from transformer 86 for time delay relay 76 and for power supply 88, which supplies appropriate d.c. operating voltages to oscillator 14, amplifier 38, multiplier 42 and amplifier 64 through busses 90, 92, 94 and 96, respectively.

In actual operation, it may be desirable to use, for the introduction of the secondary voltage from oscillator 14 into power line 10, the circuit modification shown in FIG. 3. The remainder of the circuit may be identical with that of FIG. 1.

In FIG. 3, an output transformer 100 has been provided for the voltage from oscillator or secondary source 14. Transformer 100 has primary 102 and secondary 104. Primary 102 has $N_1$ turns and secondary 104 as $N_2$ turns.

Primary 102 is shunted by a resistor 106 of value $R_T$. Secondary 104 has terminal 220 connected to "hot" line 10.

Inherently, the output impedance of oscillator 14 is high. In order to get a sufficiently high voltage out of the oscillator 14 to make the insulation resistance measuring equipment operate effectively it is important that oscillator 14 "look" into a high impedance. At the same time the power line wants to see a low impedance where the low frequency voltage is introduced. These conflicting requirements are met by the circuit of FIG. 3. The impedance looking into the secondary 104 is, approximately $(N_2)^2$ divided by $(N_1)^2$. The ratio of $N_1$ to $N_2$ being high, a very low impedance is introduced into line 10 by this injection system. At the same time oscillator 14 "sees" a compatible impedance, namely that of resistor 106.

Further, transformer 100 has a limited number of laminations so that, in the event of a current surge or malfunction in the transmission line system, the excessive current will saturate core 110, isolating filter 12 and oscillator 14 from such destructive surge. The remainder of the circuit is as shown in FIG. 1.

While a particular embodiment of this invention has been shown and described it will be obvious to those skilled in the art that variations may be made without departing from the spirit or scope of this invention. It is the intention of the appended claims to cover all such variations.

What is claimed is:

1. The method of measuring insulation resistance in an operating, grounded a.c. power transmission system carrying electrical power at a first frequency which includes the steps of: injecting into the transmission system in series with grounding means therein an electrical voltage at a secondary frequency much lower than said first frequency; detecting the level of resistive current flowing in said grounding means in said transmission system as a result of the injection of electrical voltage at said secondary frequency; and multiplying a voltage representative of said injected voltage by a voltage representative of said detected resistive current to give a product voltage representative of said insulation resistance.

2. The method according to claim 1 which includes the additional step of displaying the product voltage as a resistance measurement.

3. The method of claim 1 including the additional step of actuating an alarm when said product voltage exceeds a predetermined level.

4. Apparatus for the measurement of the insulation resistance in an operating, grounded a.c. transmission line system carrying power at a first frequency, and having grounding means including:
   a source of a secondary voltage at a second frequency lower than said first frequency;
   injection means coupled in series with said grounding means of said source and to said transmission line system for injecting said secondary voltage into said transmission line system;
   detecting means coupled to said transmission line system for detecting the secondary current produced in said grounding means of said transmission line system by said secondary voltage; and multiplying means coupled to said detecting means and to said source for multiplying a voltage representative of said secondary voltage by a voltage representative of said secondary current to produce a voltage representative of said insulation resistance.

5. Apparatus according to claim 4 which includes, in addition, output terminals in said multiplying means across which output terminals said voltage representative of said insulation resistance appears; and, insulation resistance indicating means coupled across said output terminals.

6. Apparatus according to claim 4 which includes, in addition, output terminals on said multiplying means across which output terminals said voltage representative of said insulation resistance appears; and, alarm means coupled across output terminals and responsive to a predetermined level of said voltage representative of said insulation resistance to produce an alarm signal.

7. Apparatus according to claim 4 in which said injection means includes a step-down transformer having its primary coupled to said source and its secondary coupled in series with said grounding means of said transmission line system; and a resistor having a value corresponding to the output impedance of said source connected across said primary.

8. Apparatus according to claim 7 in which said transformer has a saturable core.

9. Apparatus according to claim 4 in which said injection means includes a high-pass filter coupled between said source and said grounding means of said transmission line system.

10. Apparatus according to claim 4 in which said detecting means includes a dropping resistor coupled in series with said grounding means in said transmission line system for producing thereacross a voltage corresponding to secondary currents flowing in said system as a result of the injection of said secondary voltage into said system; a phase shifter coupled to said source and to said dropping resistor for introducing a bucking voltage for counteracting the voltage across said resistor arising from the flow of capacitive currents in said system; and a low-pass filter coupled between said phase shifter and said multiplying means for passing only those voltages having a frequency corresponding to the frequency of said secondary voltage source.

* * * * *